US007885457B2

(12) United States Patent
Hirano et al.

(10) Patent No.: US 7,885,457 B2
(45) Date of Patent: Feb. 8, 2011

(54) IMAGE PROCESSING DEVICE AND IMAGE PROCESSING METHOD WHICH ARE CAPABLE OF DISPLAYING WHITE, BLACK AND A COLOR OTHER THAN WHITE AND BLACK AT EACH PIXEL

(75) Inventors: Atsushi Hirano, Kanagawa (JP); Yoshiro Yamaguchi, Kanagawa (JP); Yasufumi Suwabe, Kanagawa (JP); Yoshinori Machida, Kanagawa (JP); Motohiko Sakamaki, Kanagawa (JP); Takeshi Matsunaga, Kanagawa (JP); Kiyoshi Shigehiro, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 1016 days.

(21) Appl. No.: 11/390,389

(22) Filed: Mar. 28, 2006

(65) Prior Publication Data

US 2007/0031031 A1 Feb. 8, 2007

(30) Foreign Application Priority Data

Aug. 3, 2005 (JP) ............................. 2005-225507

(51) Int. Cl.

| | |
|---|---|
| ***G06K 9/00*** | (2006.01) |
| ***G06K 15/00*** | (2006.01) |
| ***G06K 1/00*** | (2006.01) |
| ***H04N 1/40*** | (2006.01) |
| ***G06F 15/00*** | (2006.01) |
| ***G03F 3/08*** | (2006.01) |

(52) U.S. Cl. ....................... 382/162; 382/165; 382/167; 358/2.1; 358/1.9; 358/3.01; 358/518

(58) Field of Classification Search ................ 382/162, 382/167, 165; 358/2.1, 1.9, 3.01, 518
See application file for complete search history.

(56) References Cited

U.S. PATENT DOCUMENTS 5,517,335 A * 5/1996 Shu ............................ 358/518

(Continued)

FOREIGN PATENT DOCUMENTS

JP A 2001-31225 2/2001

(Continued)

*Primary Examiner*—Bhavesh M Mehta
*Assistant Examiner*—Bernard Krasnic
(74) *Attorney, Agent, or Firm*—Oliff & Berridge, PLC

(57) ABSTRACT

An image processing device is provided for processing image data in order to display an image at an image display medium which is capable of displaying white, black, and colors at individual pixels, which are structured by pluralities of sub-pixels. The judgment component acquires the image data and judges whether there is a chromatic color or a non-chromatic color at each pixel. When a pixel is judged to be non-chromatic, the selection component selects a pre-specified black-and-white sub-pixel set in accordance with a gray level of the non-chromatic color. When a pixel is judged to be chromatic, the conversion component converts color data to a sub-pixel set of black and the color in accordance with a pre-specified condition. Of results of conversion, the replacement component replaces a pre-specified sub-pixel set of colors, in an individual pixel or in a pre-specified sub-pixel group, with a pre-specified black-and-white sub-pixel set.

12 Claims, 10 Drawing Sheets

U.S. PATENT DOCUMENTS

| | | | | |
|---|---|---|---|---|
| 6,657,612 | B2 * | 12/2003 | Machida et al. | 345/107 |
| 6,711,302 | B1 * | 3/2004 | Lee | 382/275 |
| 6,917,445 | B2 * | 7/2005 | Kuno et al. | 358/1.9 |
| 6,995,881 | B2 * | 2/2006 | Iida et al. | 358/529 |
| 2001/0009463 | A1 * | 7/2001 | Kuno et al. | 358/1.9 |
| 2004/0257621 | A1 * | 12/2004 | Ishihara | 358/2.1 |
| 2006/0072158 | A1 * | 4/2006 | Christie | 358/3.01 |
| 2007/0285679 | A1 * | 12/2007 | Umezawa | 358/1.2 |

FOREIGN PATENT DOCUMENTS

| | | |
|---|---|---|
| JP | A-2001-312225 | 11/2001 |
| JP | A 2002-277906 | 9/2002 |

* cited by examiner (FROM WHITE DISPLAY STATE, DISPLAY OF BLACK)

(FROM BLACK DISPLAY STATE, DISPLAY OF WHITE)

R(180), G(180), B(70)

IMAGE PROCESSING DEVICE AND IMAGE PROCESSING METHOD WHICH ARE CAPABLE OF DISPLAYING WHITE, BLACK AND A COLOR OTHER THAN WHITE AND BLACK AT EACH PIXEL

CROSS-REFERENCE TO RELATED APPLICATION

This application claims priority under 35 USC 119 from Japanese Patent Application No. 2005-225507, the disclosure of which is incorporated by reference herein.

BACKGROUND OF THE INVENTION

1. Field of the Invention

The present invention relates to an image processing device, an image processing method and an image processing program, and more particularly to an image processing device and image processing method for processing image data in order to display an image at a reflecting-type display medium which is capable of color display.

2. Description of the Related Art

Heretofore, image display mediums which have excellent display image retention characteristics and are repeatedly rewritable have been proposed, such as, for example, twisting ball displays (display by rotation of particles which are each coated half-and-half with two colors), magnetophoresis-type display mediums, thermal-rewritable display mediums, liquid crystal displays with memory characteristics, and so forth.

However, these display mediums have problems in not being able to display white colors as of paper and in having low image contrast.

Accordingly, as an image display medium for overcoming the problems described above, the technology described in, for example, Japanese Patent Application Laid-Open (JP-A) No. 2002-277906 has been proposed. For the technology described in JP-A No. 2002-277906, it is proposed that an electrophoretic display element contains a dispersion medium including liquid crystals and contains electrophoretic particles formed of titania or the like, which are dispersed in the dispersion medium. In this electrophoretic display element, the dispersion medium that is employed contains a first colorant, which is formed of a dichroic colorant featuring a high dichroism ratio, and a second colorant, which is formed of a dichroic colorant featuring a low dichroism ratio and/or two colorants formed of isotropic colorants. The first colorant and the second colorant are set with a mutually complementary color relationship. Hence, white, black and the other color displays are realized with a single capsule.

However, in an image display medium with a reflection-type juxtaposed-color structure, in which a single pixel is structured by three or more sub-pixels, when R (red), G (green) and B (blue) are displayed for displaying white, reflectivity is limited to 33% relative to an ideal white. Moreover, there is a problem in that it is necessary to establish white balance between R, G and B, so a degree of freedom of design of the colors R, G and B is reduced.

Moreover, with the technology described in JP-A No. 2002-277906, three-color display with individual dots is proposed. However, there is no discussion of data preparation of juxtaposed colors and there is no discussion of ideas such as substituting RGB with WWK {white, white, black} or the like, and there is still room for improvement in reproduction of white.

SUMMARY OF THE INVENTION

The present invention has been made in view of the above circumstances and provides an image processing device and an image processing method.

A first aspect of the present invention is an image processing device for processing image data in order to display an image at an image display medium which is capable of displaying white, black, and a color other than white and black at each of pixels, each pixel being structured by a plurality of sub-pixels. The image processing device includes: a judgment component, which acquires the image data and judges whether there is a chromatic color or a non-chromatic color at each pixel; a selection component which, when a pixel is judged to be non-chromatic by the judgment component, selects a pre-specified black-and-white sub-pixel set in accordance with a gray level of the non-chromatic color; a conversion component which, when a pixel is judged to be chromatic by the judgment component, converts color data to a sub-pixel set of black and the color other than white and black, in accordance with a pre-specified condition; and a replacement component, which replaces, in results of conversion by the conversion component, each incidence of a pre-specified sub-pixel set of colors, within one of a single pixel and a pre-specified sub-pixel group, with a pre-specified black-and-white sub-pixel set.

A second aspect of the present invention is an image processing device for processing image data in order to display an image at an image display medium which is capable of displaying white, black, and at least one of red, green and blue at each of sub-pixels which structure pixels. The image processing device includes: a judgment component, which acquires the image data and judges whether there is a chromatic color or a non-chromatic color at each pixel; a selection component which, when a pixel is judged to be non-chromatic by the judgment component, selects a pre-specified black-and-white sub-pixel set in accordance with a gray level of the non-chromatic color, which is represented by red, green and blue color data; a conversion component which, when a pixel is judged to be chromatic by the judgment component, converts data of each color to a sub-pixel set of black and one of red, green and blue in accordance with a pre-specified condition; and a replacement component, which replaces, in results of conversion by the conversion component, each incidence of a pre-specified sub-pixel set of colors, within one of a single pixel and a pre-specified sub-pixel group, with a pre-specified black-and-white sub-pixel set.

A third aspect of the present invention is an image processing method for processing image data in order to display an image at an image display medium which is capable of displaying white, black, and a color other than white and black at each of pixels, each pixel being structured by a plurality of sub-pixels. The image processing method includes: (a) after acquiring the image data, judging whether there is a chromatic color or a non-chromatic color at each pixel; (b) if a pixel has been judged to be non-chromatic in (a), selecting a pre-specified black-and-white sub-pixel set in accordance with a gray level of the non-chromatic color; (c) if a pixel has been judged to be chromatic in (a), converting color data to a sub-pixel set of black and the color other than white and black, in accordance with a pre-specified condition; and (d) replacing, in results of conversion in (c), each incidence of a pre-specified sub-pixel set of colors, within one of a single pixel and a pre-specified sub-pixel group, with a pre-specified black-and-white sub-pixel set.

A fourth aspect of the present invention is an image processing method for processing image data in order to display an image at an image display medium which is capable of displaying white, black, and at least one of red, green and blue at each of sub-pixels which structure pixels. The image processing method includes: (a) after acquiring the image data, judging whether there is a chromatic color or a non-chromatic color at each pixel; (b) if a pixel has been judged to be non-chromatic in (a), selecting a pre-specified black-and-white sub-pixel set in accordance with a gray level of the non-chromatic color, which is represented by red, green and blue color data; (c) if a pixel has been judged to be chromatic in (a), converting data of each color to a sub-pixel set of black and one of red, green and blue in accordance with a pre-specified condition; and (d) replacing, in results of conversion in (c), each incidence of a pre-specified sub-pixel set of colors, within one of a single pixel and a pre-specified sub-pixel group, with a pre-specified black-and-white sub-pixel set.

A fifth aspect of the present invention is a storage medium readable by a computer. The storage medium stores a program of instructions executable by the computer to perform a function for processing image data in order to display an image at an image display medium which is capable of displaying white, black, and a color other than white and black at each of pixels, each pixel being structured by a plurality of sub-pixels. The function comprises the steps of: (a) after acquiring the image data, judging whether there is a chromatic color or a non-chromatic color at each pixel; (b) if a pixel has been judged to be non-chromatic in step (a), selecting a pre-specified black-and-white sub-pixel set in accordance with a gray level of the non-chromatic color; (c) if a pixel has been judged to be chromatic in step (a), converting color data to a sub-pixel set of black and the color other than white and black, in accordance with a pre-specified condition; and (d) replacing, in results of conversion in step (c), each incidence of a pre-specified sub-pixel set of colors, within one of a single pixel and a pre-specified sub-pixel group, with a pre-specified black-and-white sub-pixel set.

A sixth aspect of the present invention is a storage medium readable by a computer. The storage medium stores a program of instructions executable by the computer to perform a function for processing image data in order to display an image at an image display medium which is capable of displaying white, black, and at least one of red, green and blue at each of sub-pixels which structure pixels. The function includes the steps of: (a) after acquiring the image data, judging whether there is a chromatic color or a non-chromatic color at each pixel; (b) if a pixel has been judged to be non-chromatic in step (a), selecting a pre-specified black-and-white sub-pixel set in accordance with a gray level of the non-chromatic color, which is represented by red, green and blue color data; (c) if a pixel has been judged to be chromatic in step (a), converting data of each color to a sub-pixel set of black and one of red, green and blue in accordance with a pre-specified condition; and (d) replacing, in results of conversion in step (c), each incidence of a pre-specified sub-pixel set of colors, within one of a single pixel and a pre-specified sub-pixel group, with a pre-specified black-and-white sub-pixel set.

BRIEF DESCRIPTION OF THE DRAWINGS

An embodiment of the present invention will be described in detail based on the following figures, wherein.

DETAILED DESCRIPTION OF THE INVENTION

Herebelow, an example of an embodiment of the present invention will be described in detail with reference to the drawings. This embodiment is a structure in which the present invention is applied to an image display medium.

Figure 1:
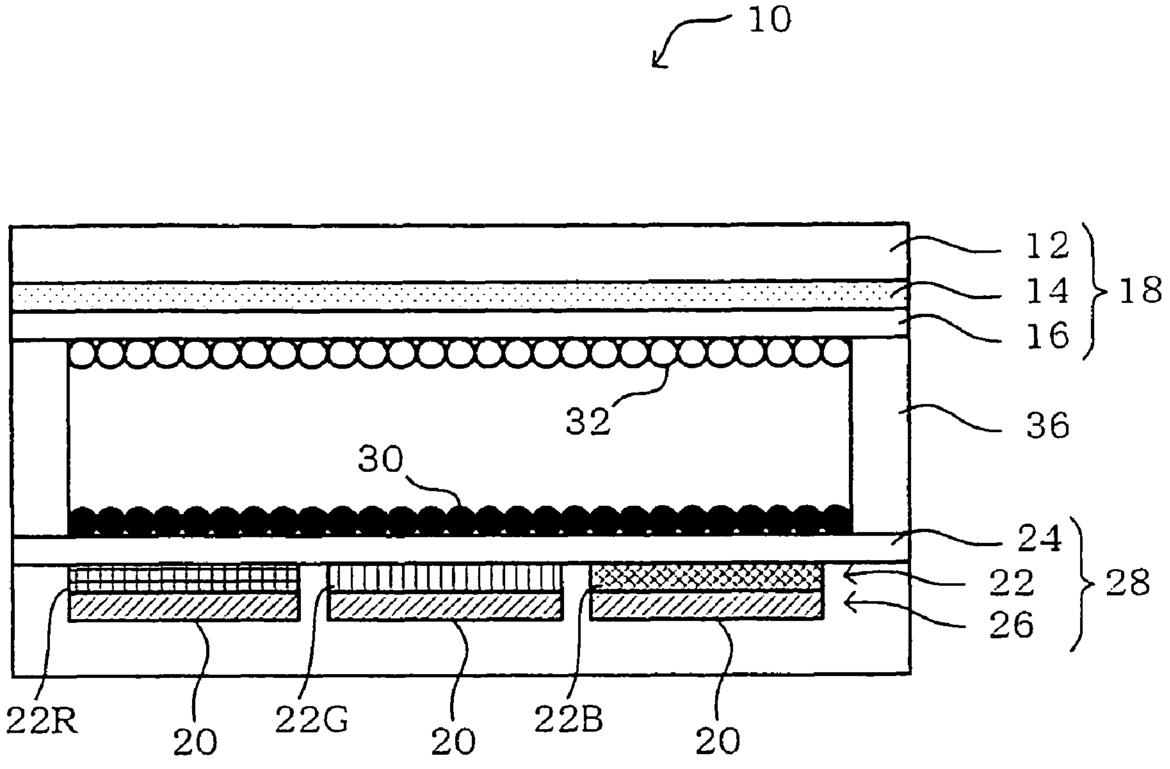
FIG. 1 is a diagram showing a partial sectional view of an image display medium relating to an embodiment of the present invention.

FIG. 1 shows a partial sectional view of the image display medium relating to the present embodiment of the 2 invention. An image display medium 10 shown in FIG. 1 is shown as a section along line A-A of FIG. 2.

Figure 2:
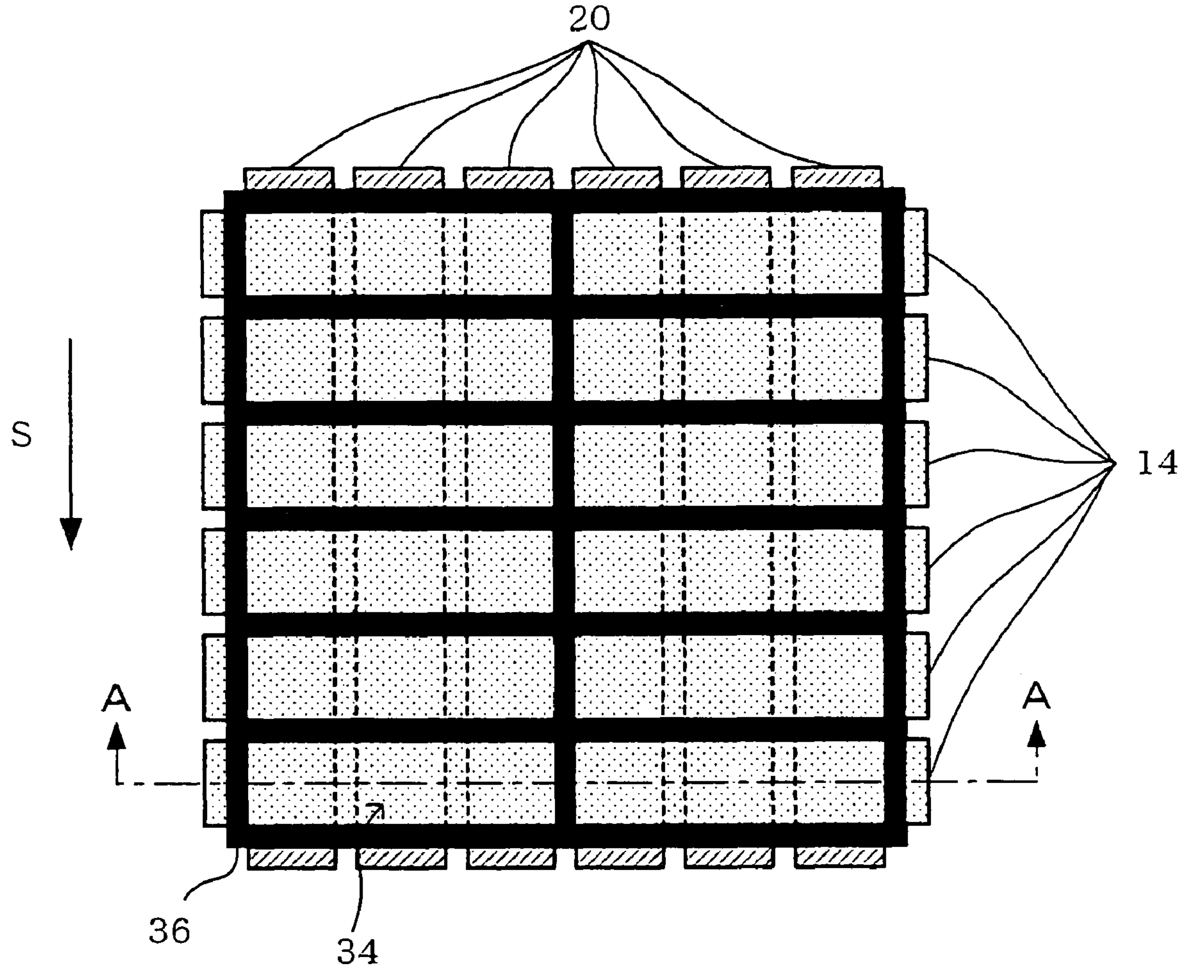
FIG. 2 is a plan view showing an arrangement of electrodes and showing spacing members.

As shown in FIG. 1, the image display medium 10 is structured with a display substrate 18, a rear face substrate 28, black particles 30 and white particles 32, and spacer members 36. At the display substrate 18, a plurality of linear, transparent scan electrodes 14 and a transparent insulation layer 16 are formed on a transparent substrate 12. At the rear face substrate 28, a colored layer 22 and a transparent insulation layer 24 are formed on a substrate 26. The colored layer 22 includes colored layers 22R, 22G and 22B, in which line-form data electrodes 20 are respectively colored. The data electrodes 20 are arranged to oppose the scan electrodes 14 so as to be orthogonal with the scan electrodes 14. The black particles 30, which are positively charged, and the white particles 32, which are negatively charged, are sealed between the substrates. The spacer members 36 divide up a plurality of cells 34, as shown in FIG. 2. Hereafter, when the colored layers 22R, 22G and 22B are to be generally referred to, they are simply referred to as the colored layer 22.

The colored layer 22 is a layer which is colored with colors which are different from the black particles 30 and the white particles 32, and is respectively colored with red (R), green (G) and blue (B) in the present embodiment.

As shown in FIG. 2, the plurality of linear scan electrodes 14 are disposed so as to be arranged in a row in a vertical direction of FIG. 2 (a scanning direction S), and to be orthogonal with the plurality of linear data electrodes 20, which are arranged in a row in a horizontal direction of FIG. 2. Positions of intersection of the respective scan electrodes 14 and data electrodes 20 constitute image elements. Here, the image elements are structured by, for example, ITO (indium tin oxide) electrode.

In the present embodiment, the spacer members 36 form a grid pattern such that the cells 34 are rectangular and are plurally formed with a length direction thereof being a direction intersecting the scanning direction S, each cell 34 including one of the scan electrodes 14 and a plurality of the data electrodes 20. In FIG. 2, a structure in which one of the scan electrodes 14 and three of the data electrodes 20 are disposed at each cell 34, that is, a structure with 1×3 pixels for each cell, serves as an example, but this is not a limitation.

The electrode arrangement with the simple matrix structure of FIG. 2 is an example. Obviously, in practice, numbers of electrodes will be formed at each substrate in accordance with required numbers of image elements. That is, when m rows by n columns of image elements are required, m of the scan electrodes 14 will be formed on the substrate 12 and n of the data electrodes 20 will be formed on the substrate 26.

Further, the present embodiment has a structure in which the scan electrodes 14 are provided at the display substrate side and the data electrodes 20 are provided at the rear face substrate side. However, conversely, structures are possible in which data electrodes are provided at the display substrate side and the scan electrodes are provided at a rear face substrate side.

Further yet, rather than the scan electrodes 14 and the data electrodes 20 being formed at facing side faces of the display substrate 18 and the rear face substrate 28, the scan electrodes 14 and data electrodes 20 could be respectively formed at faces at sides of the display substrate 18 and the rear face substrate 28 that are opposite from the facing side faces, or could be respectively disposed completely separately, outside the display substrate 18 and rear face substrate 28. In a case in which the electrodes are provided completely separately from the image display medium, it is possible to form electric fields between the substrates when the substrates are structured with members which feature permittivity.

Further again, the present embodiment has a structure in which the black particles 30 are positively charged and the white particles 32 are negatively charged. However, structures are possible in which the black particles 30 are negatively charged and the white particles 32 are positively charged. For the respective particles, it is possible to employ, for example, insulative particles and conductive particles, or the like.

Herein, for respective materials structuring the image display medium 10, the materials described in, for example, Japanese Patent Application Laid-Open (JP-A) No. 2001-312225 may be employed.

In the image display medium 10 described above, a predetermined voltage which is capable of assuring a required density (for example, ±140 V), which is a voltage necessary to generate a potential difference between the substrates that is at least capable of moving the particles, is applied between one of the scan electrodes 14 and one of the data electrodes 20, and the black particles 30 and white particles 32 at the position of this application move between the substrates. For example, when a predetermined voltage which makes a potential of the scan electrode 14 positive relative to the data electrode 20 (for example, +140 V) is applied between the electrodes, the positively charged black particles 30 at the display substrate 18 side move toward the rear face substrate 28, and the negatively charged white particles 32 at the rear face substrate 28 side move toward the display substrate 18. In contrast, when a predetermined voltage which makes the potential of the scan electrode 14 negative relative to the data electrode 20 (for example, −140 V) is applied between the electrodes, the negatively charged white particles 32 at the display substrate 18 side move toward the rear face substrate 28 and the positively charged black particles 30 at the rear face substrate 28 side move toward the display substrate 18.

Thus, the particles are moved in accordance with an image by application of the positive and negative predetermined voltages between the data electrodes 20 and the scan electrodes 14 at positions corresponding to image elements at which the particles are to be moved, and the image can be displayed. After the applications of voltages have stopped, the black particles 30 and the white particles 32 are left adhered to the display substrate 18 and the rear face substrate 28 by van der Waals forces, mirror image forces or the like, and image display is maintained.

Figure 3A:
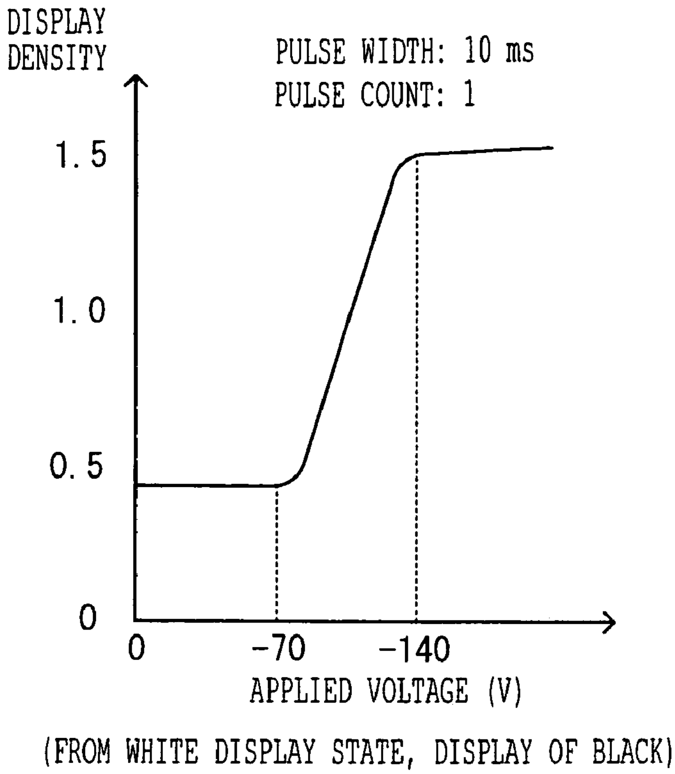
FIG. 3A is a graph showing a density characteristic at a time of switching from white display to black display.
Figure 3B:
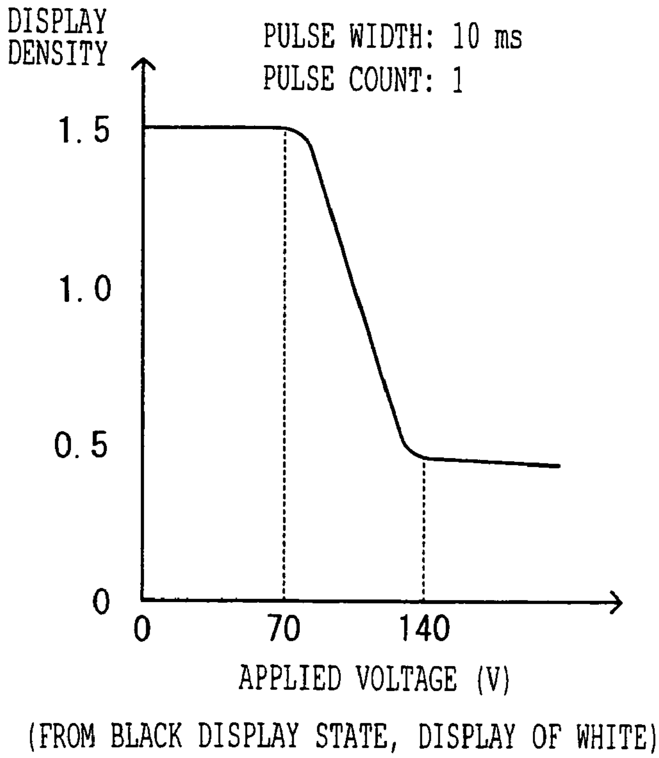
FIG. 3B is a graph showing a density characteristic at a time of switching from black display to white display.

For the present embodiment, as an example, a case in which density characteristics of the image display medium 10 are the characteristics shown in FIGS. 3A and 3B is described. Specifically, with these characteristics, it is possible to move the black particles 30 or the white particles 32 to the display substrate 18 side and obtain a satisfactory density by setting a voltage that is applied to the scan electrode 14 relative to the data electrode 20 to −140 V or +140 V, and it is possible to block movement of the particles by setting the voltage that is applied to the scan electrode 14 relative to the data electrode 20 to −70 V or +70 V. Note that FIGS. 3A and 3B illustrate a case in which a pulse width of an applied voltage is 10 ms and a pulse count is 1.

Figure 4A:
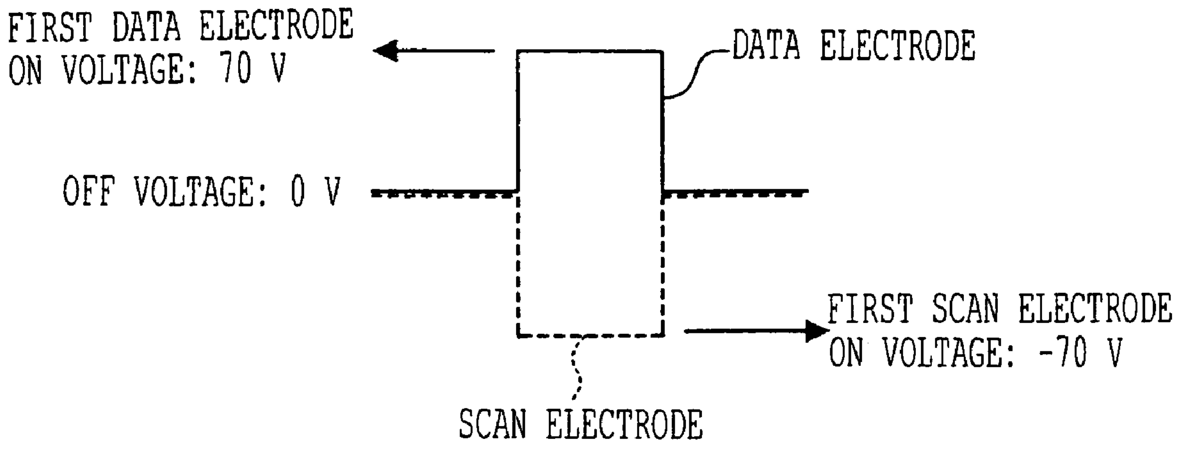
FIG. 4A is a diagram for explaining On voltages and Off voltages which are applied to the electrodes.

Various values can be specified for values of On voltages and Off voltages for black display which are applied to the scan electrode 14 and the data electrode 20, that is, voltages which are applied to the respective electrodes when the black particles 30 are to be moved toward the display substrate 18. However, in the present embodiment, as shown in FIG. 4A, a first scan electrode On voltage, to be applied to the scan electrode 14, is set to −70 V, a first data electrode On voltage, to be applied to the data electrode 20, is set to +70 V, and Off voltages to be applied to the scan electrode 14 and the data electrode 20 are set to 0 V.

Similarly, various values can be specified for values of On voltages and Off voltages for white display that are applied to the scan electrode 14 and the data electrode 20, that is, voltages which are applied to the respective electrodes when the white particles 32 are to be moved toward the display substrate 18. However, in the present embodiment, a second scan electrode On voltage, to be applied to the scan electrode 14, is set to +70 V, with the opposite polarity to the first scan electrode On voltage, a second data electrode On voltage, to be applied to the data electrode 20, is set to −70 V, with the opposite polarity to the first data electrode On voltage, and Off voltages to be applied to the scan electrode 14 and the data electrode 20 are set to 0 V, the same as the Off voltages for black display.

Figure 4B:
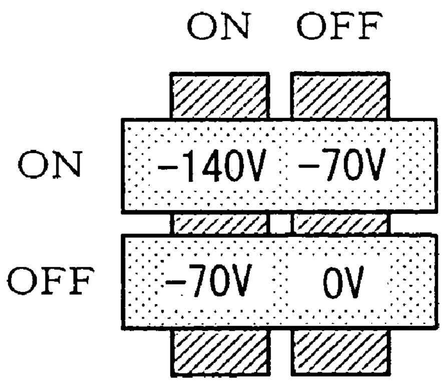
FIG. 4B is a diagram for explaining voltages that are applied to respective electrodes when an On voltage or an Off voltage is applied to each electrode.

In the case in which the On voltages and Off voltages for black display are specified as described above, when the On voltages for black display are applied to both the scan electrode 14 and the data electrode 20, as shown in FIG. 4B, the voltage applied to the scan electrode 14 is −140 V relative to the data electrode 20, and the black particles 30 at that image element (an image portion) move toward the display substrate 18.

Further, where the first scan electrode On voltage is applied to the scan electrode 14 but the Off voltage is applied to the data electrode 20, the voltage applied to the scan electrode 14 is −70 V relative to the data electrode 20, and the particles at that image element (a non-image portion) do not move. Similarly, where the Off voltage is applied to the scan electrode 14 but the first data electrode On voltage is applied to the data electrode 20, the voltage applied to the scan electrode 14 is −70 V relative to the data electrode 20, and the particles at that image element do not move. Where the Off voltage is applied to the scan electrode 14 and the Off voltage is applied to the data electrode 20, the voltage applied to the scan electrode 14 relative to the data electrode 20 is 0 V, and particles at that image element do not move. Herein, a case of white display is the same as the case of black display except that the polarities are reversed.

Initialization driving is performed to make a distribution of particles within the cell 34, that is, a particle density, uniform, and finally set the cell 34 to white display. When initialization driving is performed, an alternating voltage is applied between the scan electrodes 14 and the data electrodes 20 as an initialization driving voltage. For example, a first scan electrode initialization voltage is 140 V and a second scan electrode initialization voltage is 0 V, and these are alternately applied to the scan electrodes 14 with a predetermined pulse width. Simultaneously therewith, a first data electrode initialization voltage is 0 V and a second data electrode initialization voltage is 140 V, and these are alternately applied to the data electrodes 20 with the predetermined pulse width. Thus, the alternating voltage is applied to the scan electrodes 14 and the data electrodes 20. Hence, this is performed for a predetermined pulse count. Finally, in order to produce white display, the first scan electrode initialization voltage is applied for the scan electrodes 14, and the first data electrode initialization voltage is applied to the data electrodes 20. It is preferable if a pulse width at this time is longer than the predetermined pulse width, in order to enable implementation of white display with a more stable density. Herein, the predetermined pulse count is set to a number which can thoroughly uniform the distribution of particles.

Figure 5A:
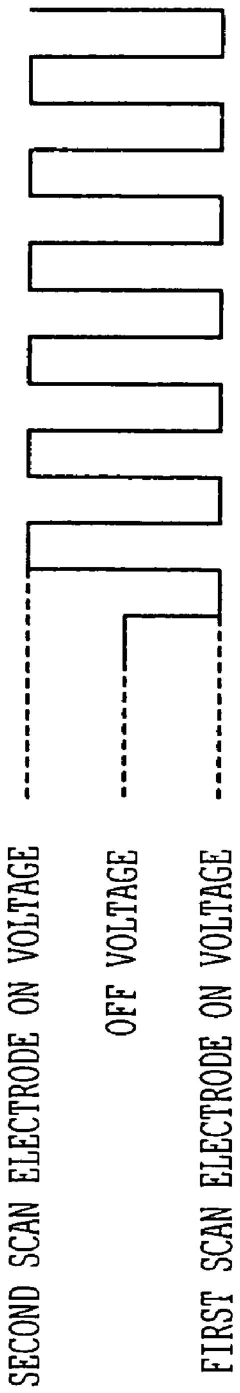
FIGS. 5A, 5B and 5C are charts showing waveforms of voltages that are applied at a time of clearance driving.
Figure 5B:
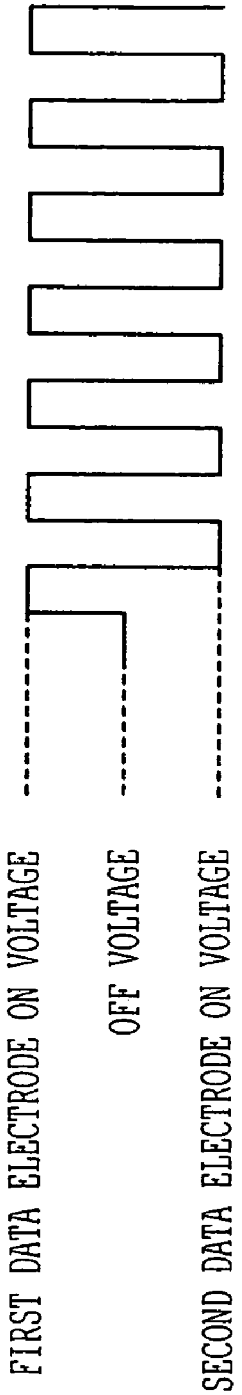
Figure 5C:
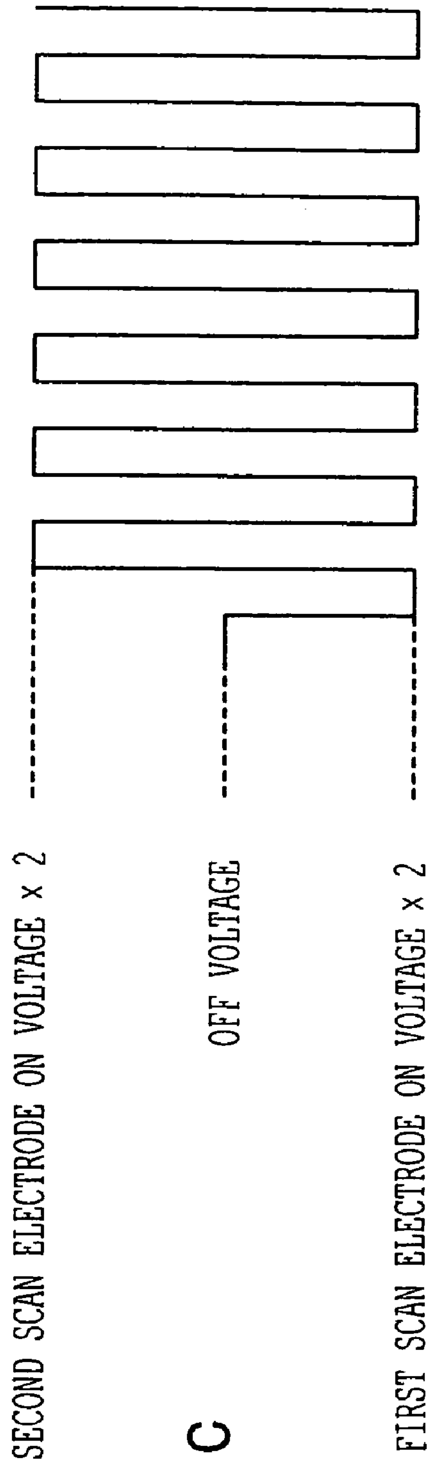

When a color other than those of the particles, that is, a color of the colored layers 22R, 22G and 22B, is to be displayed at a predetermined image element in a cell, a pulse voltage in which the first scan electrode On voltage and the second scan electrode On voltage are alternately applied to the scan electrode 14 corresponding to the predetermined pixel with a predetermined pulse width, as shown in FIG. 5A, is applied for a predetermined pulse count, and a pulse voltage in which the first data electrode On voltage and the second data electrode On voltage are alternately applied to the data electrode 20 corresponding to the predetermined pixel with a predetermined pulse width, as shown in FIG. 5B, is applied for a predetermined pulse count. That is, pulse voltages are applied to the scan electrode 14 and the data electrode 20 with phases being 180° apart. Thus, as shown in FIG. 5C, an alternating voltage in which a voltage of twice the first scan electrode On voltage (−140 V) and a voltage of twice the second scan electrode On voltage (+140 V) are alternately applied to the scan electrode 14 is applied. A frequency of the alternating voltage is, for example, 200 Hz, and the predetermined pulse count is, for example, 20 pulses. However, these are not limiting. Herebelow, the pulse voltage shown in FIG. 5A with the predetermined pulse count is referred to as a scan electrode pulse voltage, and the pulse voltage shown in FIG. 5B with the predetermined pulse count is referred to as a data electrode pulse voltage.

Meanwhile, the Off voltages are applied to the scan electrodes 14 and data electrodes 20 corresponding to image elements other than the predetermined image element.

As a result, while particles at the region of the predetermined image element are reciprocatingly moved between the substrates, the particles are moved to regions of other image elements in the cell by edge fields between neighboring data electrodes (electric fields in directions parallel to substrate faces). Thus, the colored layer 22 is exposed, and the color thereof is displayed.

Figure 6:
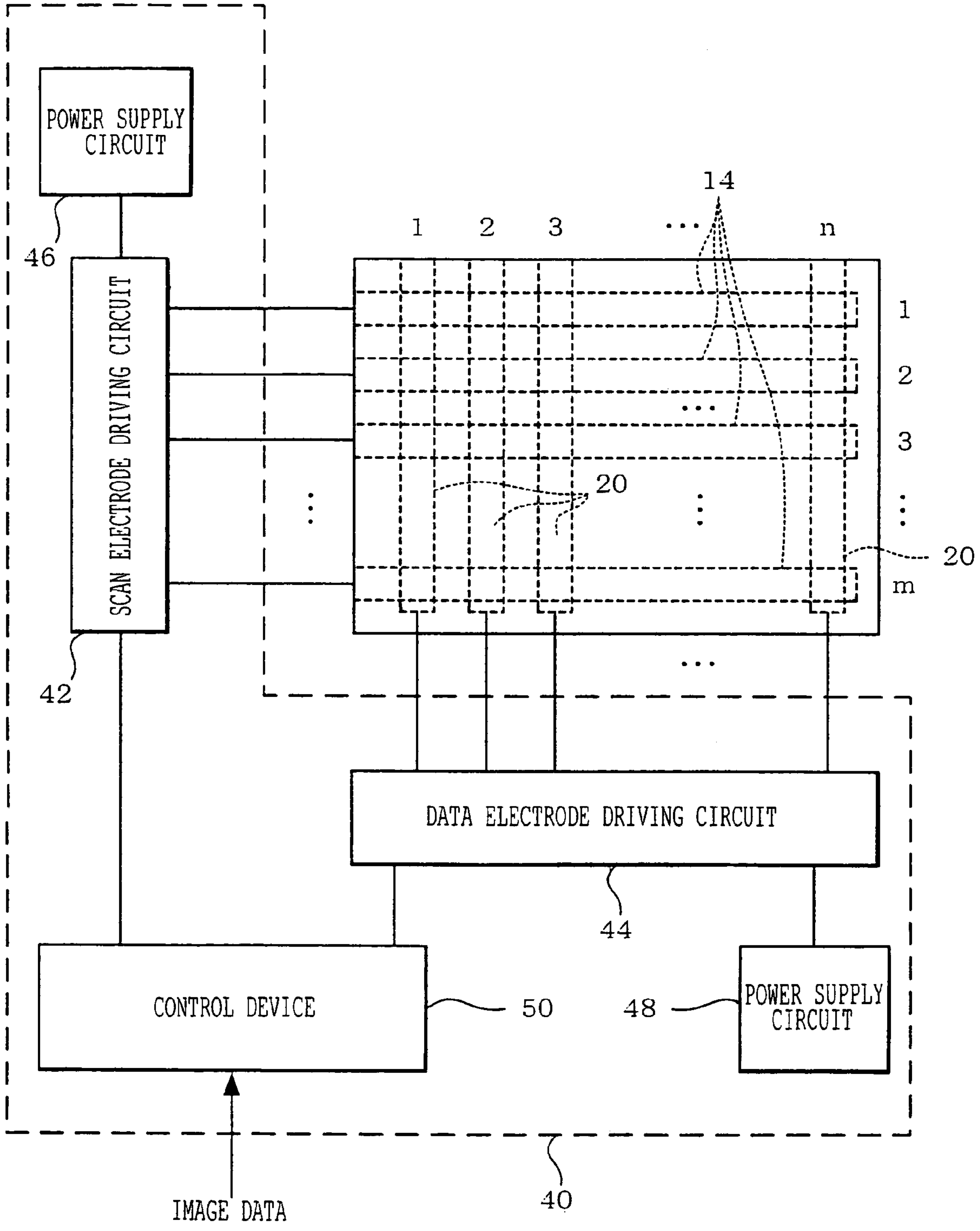
FIG. 6 is a block diagram showing general structure of the image display medium relating to the embodiment of the present invention.

FIG. 6 is a block diagram showing general structure of the image display medium 10 relating to the present embodiment of the invention. FIG. 6 shows general structure of a driving device 40 for displaying an image at the image display medium 10 on the basis of image data.

The driving device 40 is structured to include a scan electrode driving circuit 42, a data electrode driving circuit 44, power supply circuits 46 and 48, and a control device 50.

The scan electrode driving circuit 42 is respectively connected to each of the scan electrodes 14, and respectively applies various voltages supplied from the power supply circuit 46—the first scan electrode initialization voltage and the second scan electrode initialization voltage, the first scan electrode On voltage and the second scan electrode On voltage, the Off voltage, and suchlike—to the scan electrodes 14 in accordance with instructions from the control device 50.

The data electrode driving circuit 44 is respectively connected to each of the data electrodes 20, and respectively applies various voltages supplied from the power supply circuit 48—the first data electrode initialization voltage and the second data electrode initialization voltage, the first data electrode On voltage and the second data electrode On voltage, the Off voltage, and suchlike—to the data electrodes 20 in accordance with instructions from the control device 50.

Thus, the scan electrode driving circuit 42 is respectively connected to each scan electrode 14, and respectively applies the various voltages supplied from the power supply circuit 46 to the scan electrodes 14 in accordance with commands of the control device 50.

The data electrode driving circuit 44 is respectively connected to each data electrode 20, and respectively applies the various voltages supplied from the power supply circuit 48 to the data electrodes 20 in accordance with commands of the control device 50.

Image data corresponding to an image which is to be displayed at the image display medium 10 is inputted to the control device 50. On the basis of the inputted image data, the control device 50 outputs, to the scan electrode driving circuit 42, a column number designation signal for designating a column number of the scan electrode 14 that is a scanning object, and a scan electrode voltage designation signal for designating a kind of application voltage. Meanwhile, on the basis of a line image corresponding to the scan electrode 14 designated by the column number designation signal, the control device 50 outputs, to the data electrode driving circuit 44, row number designation signals for designating row numbers of the data electrodes 20 to which predetermined voltages are to be applied, and data electrode voltage designation signals for designating the kinds of the predetermined voltages.

The scan electrode driving circuit 42 applies a voltage of the kind designated by the scan electrode voltage designation signal to the scan electrode 14 of the column designated by the column number designation signal from the control device 50, and applies the Off voltage to the scan electrodes 14 other than the scan electrode 14 designated by the column number designation signal.

The data electrode driving circuit 44 applies voltage(s) of the kind(s) designated by the data electrode voltage designation signals to the data electrodes 20 of the rows designated by the row number designation signals from the control device 50, and applies the Off voltage to the data electrodes 20 other than the data electrodes 20 designated by the row number designation signals.

Figure 7A:
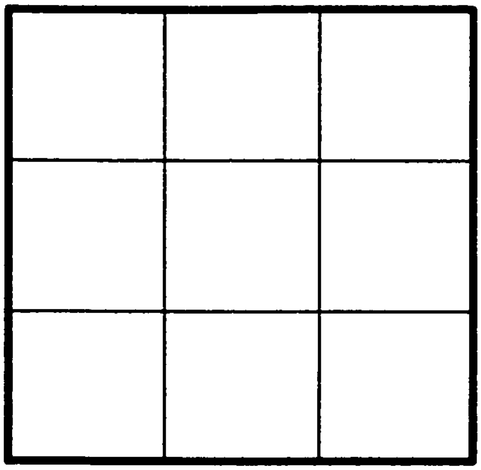
FIG. 7A is a diagram for explaining a sub-pixel.
Figure 7B:
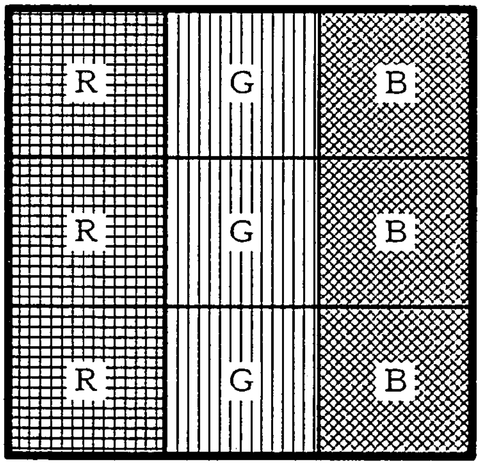
FIG. 7B is a diagram showing an example in which R, G and B colored layers are arranged in a stripe pattern.

Now, in the above explanation, a description is given with intersection positions of the data electrodes 20 and the scan electrodes 14 serving as individual image elements, that is, as individual pixels. However, in the present embodiment, the intersection positions of the data electrodes 20 and the scan electrodes 14 serve as sub-pixels, with individual pixels being structured by pluralities of the sub-pixels. In the present embodiment, as shown in FIG. 7A, one pixel is constituted by 3×3 sub-pixels. Further, of the colored layer 22 at the sub-pixels in one pixel, as shown in FIG. 7B, the R, G and B colored layers 22R, 22G and 22B are arranged so as to form a stripe pattern with the sequence: red colored layer 22R, green colored layer 22G, blue colored layer 22B.

Figure 7C:
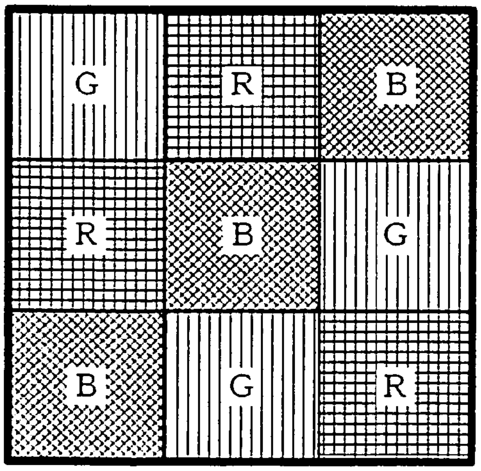
FIG. 7C is a diagram showing an example in which the R, G and B colored layers are arranged in an irregular pattern.

Herein, the arrangement of the colors R, G and B of the colored layer 22 is not limited thus, and may be, for example, a sequence differing from the R, G, B arrangement sequence, and may be an irregular pattern, as shown in FIG. 7C. Moreover, although it is preferable if the sub-pixels are square, the sub-pixels need not have square shapes. For example, it is possible for a single pixel to be square with sub-pixels being rectangular with an aspect ratio of 1:3. Moreover, although it is preferable if the individual pixels are square, the pixels need not have square shapes.

Next, an image data conversion process which is carried out at the control device 50 before an image is displayed at the image display medium 10 will be described.

At the control device 50, when image data corresponding to an image which is to be displayed at the image display medium 10 is inputted, the following conversion processing is performed.

Figure 8:
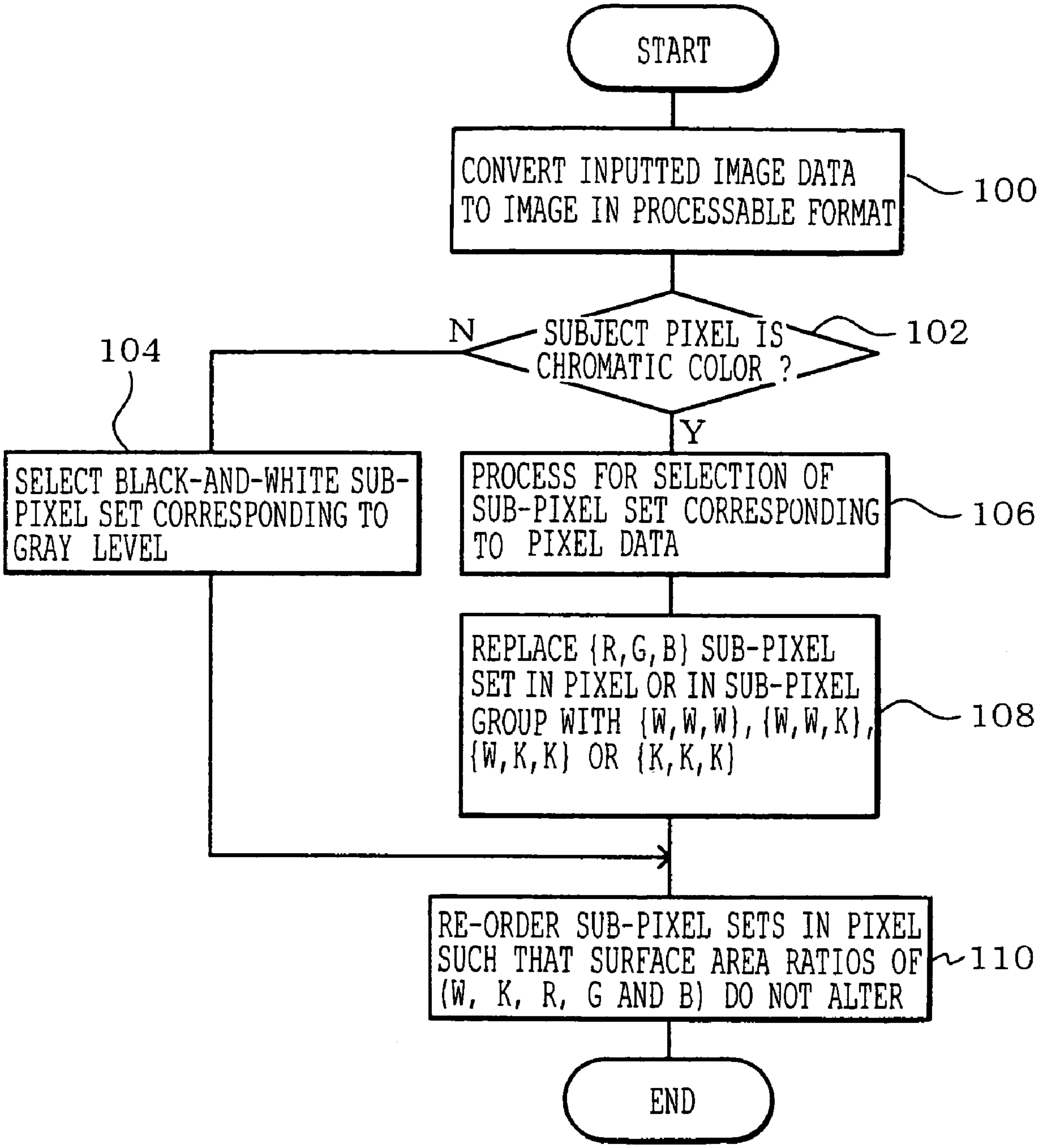
FIG. 8 is a flowchart showing an example of a flow of processing for conversion of image data, which is performed by a control device of the image display medium relating to the embodiment of the present invention.

FIG. 8 is a flowchart showing an example of flow of the image data conversion processing which is performed by the control device 50 of the image display medium 10 relating to the present embodiment of the invention.

First, in step 100, the image data inputted to the control device 50 is converted to an image in a format which can be processed. For example, in the present embodiment, in order to perform processing in the RGB color space, color conversion processing is performed in a case with image data of a different color space.

In a next step 102, for each pixel of the inputted image data, it is judged whether or not the pixel is chromatic. For this judgment, it is determined whether or not respective differences between absolute values of R, G and B for each pixel are less than a pre-specified threshold. For example, $|Ci-Ck| \leqq Th$, where Ci,Ck={R(r),G(g),B(b)} and the threshold Th=10. That is, it is determined whether or not the values of R, G and B are all substantially equal values. Here, R(r), G(g) and B(b) represent values of the colors R, G and B in the pixel, and respectively assume values from 0 to 255 ($0 \leqq R(r), G(g), B(b) \leqq 255$).

Then, when the judgment of step 102 is positive, that is, when a pixel is chromatic, the process advances to step 106, and when the judgment of step 102 is negative, that is, when a pixel is non-chromatic, the process advances to step 104.

In step 104, selection of a black-and-white sub-pixel set corresponding to a gray level is performed, and the process advances to step 110. More specifically, when there are nine sub-pixels, values of the colors R, G and B are averaged, and a non-chromatic gray-level value Gray(t)={R(r)+G(g)+B(b)}/3. Furthermore, black-and-white sub-pixel sets corresponding to gray-level values are determined beforehand, and a black-and-white sub-pixel set is selected in accordance with the gray-level value that is calculated.

For example, sub-pixel sets of white (W) and black (K) according to gray-level values are determined beforehand as shown below.

For $0 \leqq Gray(t) \leqq 25$, the black-and-white sub-pixel set is {KKKKKKKKK}.

For $25 < Gray(t) \leqq 50$, the black-and-white sub-pixel set is {KKKKKKKKW}.

For $50 < Gray(t) \leqq 75$, the black-and-white sub-pixel set is {KKKKKKKWW}.

For $75 < Gray(t) \leqq 100$, the black-and-white sub-pixel set is {KKKKKKWWW}.

For $100 < Gray(t) \leqq 125$, the black-and-white sub-pixel set is {KKKKKWWWW}

For $125 < Gray(t) \leqq 150$, the black-and-white sub-pixel set is {KKKKWWWWW}.

For $150 < Gray(t) \leqq 175$, the black-and-white sub-pixel set is {KKKWWWWWW}.

For $175 < Gray(t) \leqq 200$, the black-and-white sub-pixel set is {KKWWWWWWW}.

For $200 < Gray(t) \leqq 225$, the black-and-white sub-pixel set is {KWWWWWWWW}.

For $225 < Gray(t) \leqq 255$, the black-and-white sub-pixel set is {WWWWWWWWW}.

On the other hand, in step 106, selection of sub-pixel sets corresponding to the pixel data is performed, and then the process advances to step 108. Specifically, when there are nine sub-pixels, being three sub-pixels of each of the colors R, G and B, it is determined what kind of signal sets to select for the three sub-pixels of each color.

More specifically, sub-pixel sets corresponding to values of each color are determined beforehand, and a sub-pixel set is selected in accordance with the value of each color. For example, the sub-pixel sets corresponding to the values of each color are determined as shown below. Below, R is shown as an example, but the sub-pixel sets for G and B are determined in a similar manner.

For $0 \leqq R(r) \leqq 64$, the sub-pixel set is {KKK}.

For $64 < R(r) \leqq 128$, the sub-pixel set is {RKK}.

For $128 < R(r) \leqq 192$, the sub-pixel set is {RRK}.

For $192 < R(r) \leqq 255$, the sub-pixel set is {RRR}.

In the next step 108, a sub-pixel set of {R,G,B} in one pixel or in a group of sub-pixels is replaced with {W,W,W}, {W,W,K}, {W,K,K} or {K,K,K}, and the process advances to step 110. That is, where sub-pixels of R, G and B are arranged in a row, these are replaced with black and/or white sub-pixels. Here, this black-and-white substitution is pre-specified such that any one of the above is replaced in accordance with colors of filters (the colored layer 22 in the present embodiment) and particles, or the like.

Then, in step 110, the sub-pixel sets in the pixel are re-ordered such that surface area ratios of (W, K, R, G and B) do not change, and sequence processing is performed. Because the arrangement of R, G and B is determined by the arrangement of the colored layer 22 in the pixel, the re-ordering within the pixel implements sorting in consideration of the arrangement of R, G and B. Further, because driving methods for times of displaying white, black, R, G and B are respectively different, the re-ordering in the pixel is performed in consideration of the driving methods.

After the image data conversion processing has been performed as described above, the control device 50 controls the scan electrode driving circuit 42 and the data electrode driving circuit 44, and driving of the image display medium 10 is performed on the basis of the image data which has been converted by the conversion processing.

Figure 9A:
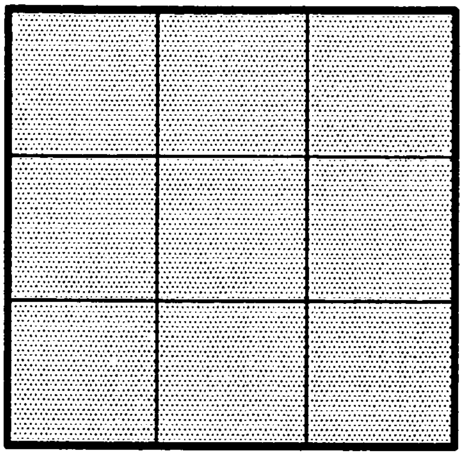
FIGS. 9A, 9B and 9C are diagrams for explaining an example in which a pixel of R(180), G(180), B(70) is converted by the conversion processing.
Figure 9B:
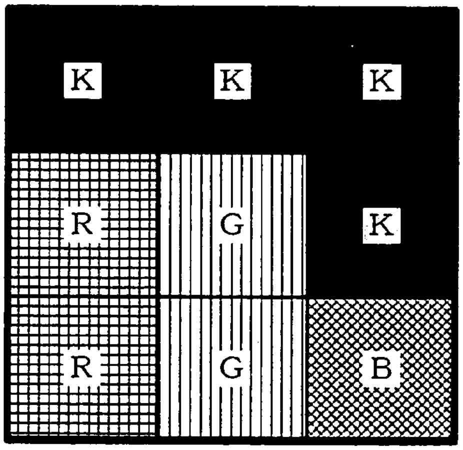
Figure 9C:
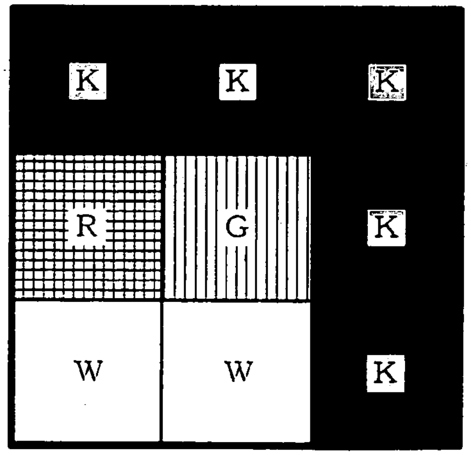

For example, in a case of converting a pixel of R(180), G(180) and B(70), shown in FIG. 9A, by the above conversion processing, the pixel has a chromatic color, so step 102 has a positive result. In step 106, because R is (180), the sub-pixel set {R,R,K} is selected, because G is (180), the sub-pixel set {G,G,K} is selected, and because B is (70), the sub-pixel set {B,K,K} is selected, for the state shown in FIG. 9B. In step 108, as a substitution of a set of R, G and B sub-pixels with {W,W,K}, an R,G,B sub-pixel set is replaced with {W,W,K} for the state shown in FIG. 9C.

Figure 10A:
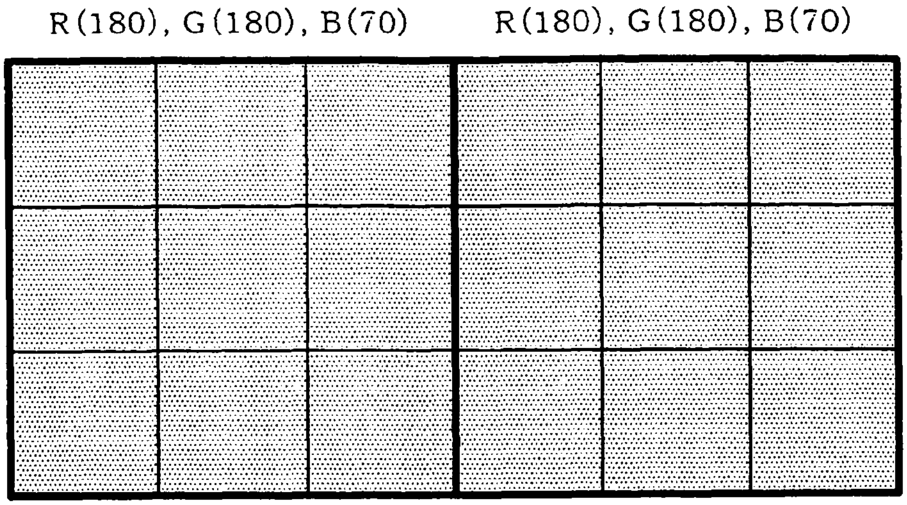
FIGS. 10A, 10B and 10C are diagrams for explaining an example of conversion by the conversion processing, in a case in which pixels of R(180), G(180), B(70) are adjacent in a row.
Figure 10B:
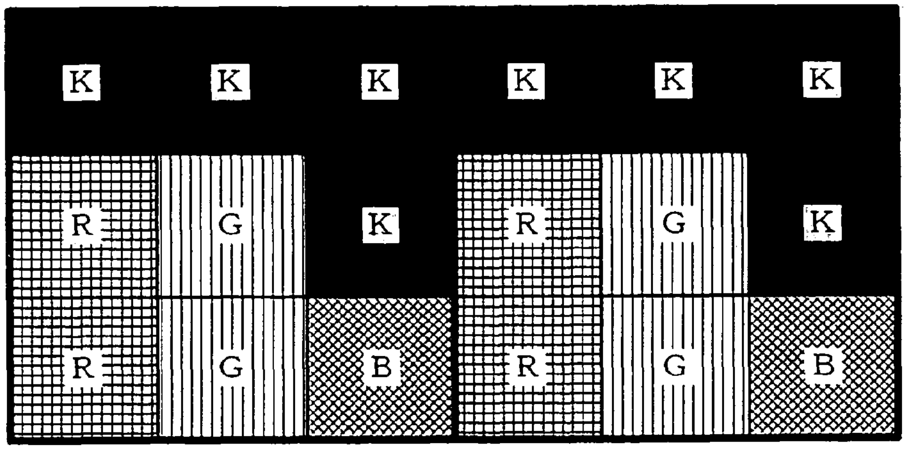
Figure 10C:
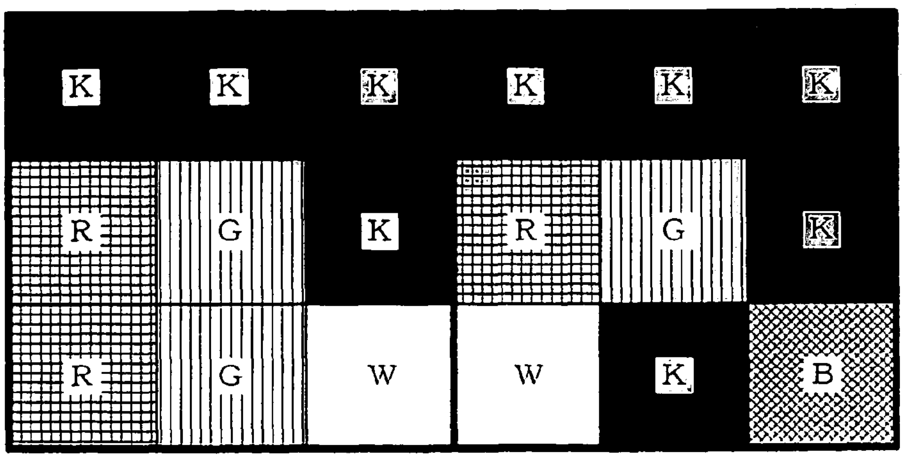

Further, in a case in which pixels of R(180), G(180) and B(70) adjoin as shown in FIG. 10A, the pixels have chromatic colors, so step 102 has positive results. In step 106, because each R is (180), sub-pixel sets of {R,R,K} are selected, because each G is (180), sub-pixel sets of {G,G,K} are selected, and because each B is (70), sub-pixel sets of {B,K,K} are selected, for the state shown in FIG. 10B. In step 108, as a substitution of a set of R, G and B sub-pixels in a sub-pixel group with {W,W,K}, an R,G,B sub-pixel set is replaced with {W,W,K} for the state shown in FIG. 10C.

That is, in the present embodiment, when a white color is to be expressed, R, G and B are replaced and the white color is expressed with the white particles 32, and white reproduction when white is being expressed using color image data can be improved. Further, because white is expressed with the white particles 32, there is no need for precise design for white balance of the colors R, G and B, and a degree of freedom of design for each of the required colors R, G and B can be improved.

Moreover, because the above-described conversion processing is performed: it is possible to alter brightness without altering saturation of a pixel; it is possible to set brightness by colors and brightnesses of neighboring pixels, by whether a pixel belongs to a text region, belongs to a solid color region or belongs to a pictorial image portion, by brightness of environmental conditions, and the like; and it is possible to select optimal saturations and brightnesses for each situation.

Now, in a case of displaying an image by employing white particles, black particles and the colored layer 22 and moving the particles, as in the image display medium 10 described for the present embodiment, rear face colors are disposed to be separated by a certain distance from a viewing side substrate. When the rear face colors are being observed, problems arise with viewing angles. In contrast, when the white particles 32 and the black particles 30 are viewed, because the particles that are being viewed are disposed close to the viewing side substrate, viewing angles are an insignificant problem. That is, by using the particles for portions which would be expressed using the rear face colors, it is possible to improve the matter of viewing angles.

Furthermore, in a case of displaying an image by employing white particles, black particles and the colored layer 22 and moving the particles, as in the image display medium 10 described for the present embodiment, when an area of rear face color display portions increases, space for storing excess particles may become insufficient. Consequently, there will be occurrences of particles remaining at the rear face color display portions. However, in the present embodiment, because it is possible to replace rear face color display portions with particle display portions without changing colors of the pixels, it is possible to improve display characteristics of the pixels.

Anyway, for the embodiment described above, an example has been described in which RGB color space data is used for the conversion processing described above. However, this is not a limitation. For example, YMC color space data may be used, and other color space data may be used.

Furthermore, for the embodiment described above, an example has been described of an image display medium which expresses an image with the white particles 32, the black particles 30 and the colored layer 22. However, this is not a limitation. For example, it is possible to employ an image display medium which includes sub-pixels which can display four or more colors, at which intermediate colors can be displayed by mixtures of white particles, color particles and black plates, or the like. It is also possible to employ an electrophoresis-type image display medium, an image display medium which utilizes leuco materials, an image display medium which utilizes magnetic particles, an image display medium of an electrochromy or thermal type, or the like. Further yet, as means for expressing two or more colors with the present embodiment, it is possible to employ twisting particles which are colored with two or more colors, and it is possible to employ liquid crystals as a means for expressing two or more colors. As the liquid crystals in such a case, light-writable liquid crystals may be employed, and guesthost liquid crystals may be employed.

As described earlier, a first aspect of the present invention is an image processing device for processing image data in order to display an image at an image display medium which is capable of displaying white, black, and a color other than white and black at each of pixels, each pixel being structured by a plurality of sub-pixels. The image processing device includes: a judgment component, which acquires the image data and judges whether there is a chromatic color or a non-chromatic color at each pixel; a selection component which, when a pixel is judged to be non-chromatic by the judgment component, selects a pre-specified black-and-white sub-pixel set in accordance with a gray level of the non-chromatic color; a conversion component which, when a pixel is judged to be chromatic by the judgment component, converts color data to a sub-pixel set of black and the color other than white and black, in accordance with a pre-specified condition; and a replacement component, which replaces, in results of conversion by the conversion component, each incidence of a pre-specified, sub-pixel set of colors, within one of a single pixel and a pre-specified sub-pixel group, with a pre-specified black-and-white sub-pixel set.

According to the invention of the first aspect, the image display medium is structured with a plurality of sub-pixels for one pixel, the one pixel is capable of displaying colors, white and black, and image data is processed in order to display an image at the image display medium.

At the judgment component, the image data is acquired, and each pixel is judged to be chromatic or non-chromatic. Then, for a pixel which has been judged to be non-chromatic by the judgment component, a pre-specified black-and-white sub-pixel set is selected by the selection component in accordance with a gray level of the non-chromatic color. In other words, at non-chromatic pixels, the sub-pixels are displayed in black and white.

On the other hand, for a pixel which has been judged to be chromatic by the judgment component, the color data is converted to black and color sub-pixel sets by the conversion component in accordance with pre-specified conditions. Subsequently, a pre-specified set of color sub-pixels in the one pixel or in a pre-specified sub-pixel group is replaced with a pre-specified black-and-white sub-pixel set by the replacement component. That is, a color combination that can be expressed by black and white is substituted with black and white to be displayed.

Thus, when white is to be displayed using color image data, colors that can be replaced with black and white are substituted with black and white as described above, and reproduction of white can be improved.

A second aspect of the present invention is an image processing device for processing image data in order to display an image at an image display medium which is capable of displaying white, black, and at least one of red, green and blue at each of sub-pixels which structure pixels. The image processing device includes: a judgment component, which acquires the image data and judges whether there is a chromatic color or a non-chromatic color at each pixel; a selection component which, when a pixel is judged to be non-chromatic by the judgment component, selects a pre-specified black-and-white sub-pixel set in accordance with a gray level of the non-chromatic color, which is represented by red, green and blue color data; a conversion component which, when a pixel is judged to be chromatic by the judgment component, converts data of each color to a sub-pixel set of black and one of red, green and blue in accordance with a pre-specified condition; and a replacement component, which replaces, in results of conversion by the conversion component, each incidence of a pre-specified sub-pixel set of colors, within one of a single pixel and a pre-specified sub-pixel group, with a pre-specified black-and-white sub-pixel set.

According to the invention of the second aspect, it is possible to display white, black and one of red, green and blue at each of the sub-pixels structuring the pixels, and image data is processed in order to display an image at the image display medium.

At the judgment component, the image data is acquired, and each pixel is judged to be chromatic or non-chromatic. Then, for a pixel which has been judged to be non-chromatic by the judgment component, a pre-specified black-and-white sub-pixel set is selected by the selection component in accordance with a gray level of the non-chromatic color, which is expressed by red, green and blue color data. In other words, at non-chromatic pixels, the sub-pixels are displayed in black and white.

On the other hand, for a pixel which has been judged to be chromatic by the judgment component, the red, green and blue color data is converted to black and color sub-pixel sets in accordance with pre-specified conditions by the conversion component. Subsequently, a pre-specified set of color sub-pixels in the one pixel or in a pre-specified sub-pixel group is replaced with a pre-specified black-and-white sub-pixel set by the replacement component. For example, when there is a set of a red, a green and a blue sub-pixel, the replacement component replaces these with a pre-specified set of black-and-white sub-pixels. That is, a color combination that can be expressed by black and white is substituted with black and white to be displayed.

Thus, when white is to be displayed using color image data, colors that can be replaced with black and white are substituted with black and white as described above, and reproduction of white can be improved.

Here, the replacement component may replace a sub-pixel set of {red, green, blue} with a black-and-white sub-pixel set of one of {white, white, white}, {white, white, black}, {white, black, black} and {black, black, black}.

A third aspect of the present invention is an image processing method for processing image data in order to display an image at an image display medium which is capable of displaying white, black, and a color other than white and black at each of pixels, each pixel being structured by a plurality of sub-pixels. The image processing method includes: (a) after acquiring the image data, judging whether there is a chromatic color or a non-chromatic color at each pixel; (b) if a pixel has been judged to be non-chromatic in (a), selecting a pre-specified black-and-white sub-pixel set in accordance with a gray level of the non-chromatic color; (c) if a pixel has been judged to be chromatic in (a), converting color data to a sub-pixel set of black and the color other than white and black, in accordance with a pre-specified condition; and (d) replacing, in results of conversion in (c), each incidence of a pre-specified sub-pixel set of colors, within one of a single pixel and a pre-specified sub-pixel group, with a pre-specified black-and-white sub-pixel set.

According to the invention of the third aspect, the image display medium is structured with a plurality of sub-pixels for one pixel, the one pixel is capable of displaying colors, white and black, and image data is processed in order to display an image at the image display medium.

In the step of judging, the image data is acquired, and each pixel is judged to be chromatic or non-chromatic. Then, for a pixel which has been judged to be non-chromatic in the step of judging, a pre-specified black-and-white sub-pixel set is selected in the step of selecting in accordance with a gray level of the non-chromatic color. In other words, at non-chromatic pixels, the sub-pixels are displayed in black and white.

On the other hand, for a pixel which has been judged to be chromatic in the step of judging, the color data is converted to black and color sub-pixel sets in accordance with pre-specified conditions in the step of converting. Subsequently, a pre-specified set of color sub-pixels in the one pixel or in a pre-specified sub-pixel group is replaced with a pre-specified black-and-white sub-pixel set in the step of replacing. That is, a color combination that can be expressed by black and white is substituted with black and white to be displayed.

Thus, when white is to be displayed using color image data, colors that can be replaced with black and white are substituted with black and white as described above, and reproduction of white can be improved.

A fourth aspect of the present invention is an image processing method for processing image data in order to display an image at an image display medium which is capable of displaying white, black, and at least one of red, green and blue at each of sub-pixels which structure pixels. The image processing method includes: (a) after acquiring the image data, judging whether there is a chromatic color or a non-chromatic color at each pixel; (b) if a pixel has been judged to be non-chromatic in (a), selecting a pre-specified black-and-white sub-pixel set in accordance with a gray level of the non-chromatic color, which is represented by red, green and blue color data; (c) if a pixel has been judged to be chromatic in (a), converting data of each color to a sub-pixel set of black and one of red, green and blue in accordance with a pre-specified condition; and (d) replacing, in results of conversion in (c), each incidence of a pre-specified sub-pixel set of colors, within one of a single pixel and a pre-specified sub-pixel group, with a pre-specified black-and-white sub-pixel set.

According to the invention of the fourth aspect, it is possible to display white, black and one of red, green and blue at each of the sub-pixels structuring the pixels, and image data is processed in order to display an image at the image display medium.

In the step of judging, the image data is acquired, and each pixel is judged to be chromatic or non-chromatic. Then, for a pixel which has been judged to be non-chromatic in the step of judging, a pre-specified black-and-white sub-pixel set is selected in the step of selecting in accordance with a gray level of the non-chromatic color, which is expressed by red, green and blue color data. In other words, at non-chromatic pixels, the sub-pixels are displayed in black and white.

On the other hand, for a pixel which has been judged to be chromatic in the step of judging, the red, green and blue color data is converted to a black and color sub-pixel sets in accordance with pre-specified conditions in the step of converting. Subsequently, a pre-specified set of color sub-pixels in the one pixel or in a pre-specified sub-pixel group is replaced with a pre-specified black-and-white sub-pixel set in the step of replacing. For example, when there is a set of a red, a green and a blue sub-pixel, the step of replacing replaces these with a pre-specified set of black-and-white sub-pixels. That is, a color combination that can be expressed by black and white is substituted with black and white to be displayed.

Thus, when white is to be displayed using color image data, colors that can be replaced with black and white are substituted with black and white as described above, and reproduction of white can be improved.

Here, the step of replacing may replace a sub-pixel set of {red, green, blue} with a black-and-white sub-pixel set of one of {white, white, white}, {white, white, black}, {white, black, black} and {black, black, black}.

As the image display medium of the present invention, it is possible to employ, for example, an image display medium which includes: a display substrate which features at least light transmissivity; a rear face substrate which opposes the display substrate with a spacing therebetween; white particles and black particles, which are sealed between the substrates and have respectively differing electrostatic characteristics so as to move in accordance with electric fields which are formed between the substrates—the display substrate and the rear face substrate—by voltages being applied, in accordance with image data, between a plurality of first electrodes, which are arranged in a row along a pre-specified direction, and second electrodes, which are disposed to oppose the first electrodes; and a colored layer which is provided between the substrates—the display substrate and the rear face substrate.

According to the present invention as described above, there is an effect in that it is possible, when white is to be displayed using color image data, to make white reproduction characteristics excellent.

What is claimed is:

1. An image processing device for displaying image data that is represented by a collection of image elements, the image processing device comprising:

a plurality of pixels corresponding to the collection of image elements, each pixel comprising a plurality of sub-pixels, each sub-pixel comprising white particles, black particles and a colored layer and displaying one of white, black or a color of the colored layer, by moving the white particles and the black particles within the sub-pixel, wherein when the sub-pixel is displaying one of white, black or the color other than white or black, the other colors are not displayed;

a judgment component which, for each element of the image data judges whether the image element is a chromatic color or a non-chromatic color;

a selection component which, when the image element is judged to be non-chromatic by the judgment component, selects a pre-specified black-and-white sub-pixel set for the sub-pixels of the pixel that correspond to the image element in accordance with a gray level of the non-chromatic color of the image element;

a conversion component which, when the image element is judged to be chromatic by the judgment component, converts the sub-pixels of the pixel that correspond to the image element to a sub-pixel set of black and the color other than white and black based on the chromatic color of the image element in accordance with a pre-specified condition;

a replacement component which, within a single pixel or a pre-specified sub-pixel group that results from the image element that is judged to be chromatic by the judgment component and converted to a sub-pixel set of black and the color other than white and black by the conversion component, replaces each incidence of a pre-specified sub-pixel set of colors with a pre-specified black-and-white sub-pixel set, wherein the replacement component replaces a sub-pixel set of {red, green, blue} with a black-and-white sub-pixel set of one of {white, white, white}, {white, white, black}, {white, black, black} and {black, black, black}; and a reorder component, which reorders the sub-pixel set for the sub-pixels of the pixels corresponding to the image element determined to be either chromatic or non-chromatic such that the surface area ratios of white, black, red, green and blue do not change, wherein processing of each component is performed by a processor.

2. The image processing device of claim 1, wherein each sub-pixel comprises (i) a back substrate including a colored layer and (ii) a transparent front substrate, the white particles and the black particles being enclosed between the back substrate and the front substrate, each sub-pixel displaying one of white, black or the color of the color layer, by moving the white particles and the black particles between the back substrate and the transparent front substrate.

3. An image processing device for displaying image data that is represented by a collection of image elements, the image processing device comprising:

a plurality of pixels corresponding to the collection of image elements, each pixel comprising a plurality of sub-pixels, each sub-pixel comprising white particles, black particles, a red colored layer, a green colored layer and a blue colored layer and displaying one of white, black, red, green or blue, by moving the white particles and the black particles within the sub-pixel, wherein when the sub-pixel is displaying one of white, black, red, green or blue, the other colors are not displayed;

a judgment component which, for each image element of the image data, judges whether the image element is a chromatic color or a non-chromatic color;

a selection component which, when the image element is judged to be non-chromatic by the judgment component, selects a pre-specified black-and-white sub-pixel set for the sub-pixels of the pixel that correspond to the image element, in accordance with a gray level of the non-chromatic color of the image element, which is represented by red, green and blue color data;

a conversion component which, when the image element is judged to be chromatic by the judgment component, converts the sub-pixels of the pixel that correspond to the image element to a sub-pixel set of black, red, green or blue based on the chromatic color of the image element, in accordance with a pre-specified condition;

a replacement component which, within a single pixel or a pre-specified sub-pixel group that results from the image element that is judged to be chromatic by the judgment component and converted to a sub-pixel set of black and the color other than white and black by the conversion component, replaces each incidence of a pre-specified sub-pixel set of colors with a pre-specified black-and-white sub-pixel set, wherein the replacement component replaces a sub-pixel set of {red, green, blue} with a black-and-white sub-pixel set of one of {white, white, white}, {white, white, black}, {white, black, black} and {black, black, black}, and a reorder component, which reorders the sub-pixel set for the sub-pixels of the pixels corresponding to the image element determined to be either chromatic or non-chromatic such that the surface area ratios of white, black, red, green and blue do not change, wherein processing of each component is performed by a processor.

4. The image processing device of claim 3, wherein each sub-pixel comprises (i) a back substrate including a red colored layer, a green colored layer and a blue colored layer and (ii) a transparent front substrate, the white particles and the black particles being enclosed between the back substrate and the front substrate, each sub-pixel displaying one of white, black, red, green or blue, by moving the white particles and the black particles between the back substrate and the transparent front substrate.

5. An image processing method for displaying image data that is represented by a collection of image elements, the image processing method comprising:

(a) acquiring a plurality of pixels corresponding to the collection of image elements, each pixel comprising a plurality of sub-pixels, each sub-pixel comprising white particles, black particles and a colored layer and displaying one of white, black or a color of the colored layer, by moving the white particles and the black particles within the sub-pixel, wherein when the sub-pixel is displaying one of white, black or the color other than white or black, the other colors are not displayed;

(b) after acquiring the image data, for each image element of the image data, judging whether the image element is a chromatic color or a non-chromatic color;

(c) if the pixel has been judged to be non-chromatic in (b), selecting a pre-specified black-and-white sub-pixel set for the sub-pixels of the pixel that correspond to the image element in accordance with a gray level of the non-chromatic color of the image element;

(d) if the pixel has been judged to be chromatic in (b), converting the sub-pixels of the pixel that correspond to the image element to a sub-pixel set of black and the color other than white and black based on the chromatic color of the image element, in accordance with a pre-specified condition;

(e) replacing, within a single pixel or a pre-specified sub-pixel group that results from the image element that is judged to be chromatic in (b) and converted to a sub-pixel set of black and the color other than white and black in the conversion in (d), each incidence of a pre-specified sub-pixel set of colors with a pre-specified black-and-white sub-pixel set, wherein step (e) further includes replacing a sub-pixel set of {red, green, blue} with a black-and-white sub-pixel set of one of {white, white, white}, {white, white, black}, {white, black, black} and {black, black, black}; and (f) reordering the sub-pixel set for the sub-pixels of the pixels corresponding to the image element determined to be either chromatic or non-chromatic such that the surface area ratios of white, black, red, green and blue do not change, wherein the above steps are performed by a processor.

6. The image processing method of claim 5, wherein each sub-pixel comprises (i) a back substrate including a colored layer and (ii) a transparent front substrate, the white particles and the black particles being enclosed between the back substrate and the front substrate, each sub-pixel displaying one of white, black or the color of the color layer, by moving the white particles and the black particles between the back substrate and the transparent front substrate.

7. An image processing method for displaying image data that is represented by a collection of image elements, the image processing method comprising:

(a) acquiring a plurality of pixels corresponding to the collection of image elements, each pixel comprising a plurality of sub-pixels, each sub-pixel comprising white particles, black particles, a red colored layer, a green colored layer and a blue colored layer and displaying one of white, black, red, green or blue, by moving the white particles and the black particles within the sub-pixel, wherein when the sub-pixel is displaying one of white, black, red, green or blue, the other colors are not displayed;

(b) after acquiring the image data, for each image element of the image data, judging whether the image element is a chromatic color or a non-chromatic color;

(c) if the pixel has been judged to be non-chromatic in (b), selecting a pre-specified black-and-white sub-pixel set for the sub-pixels of the pixel that correspond to the image element in accordance with a gray level of the non-chromatic color of the image element, which is represented by red, green and blue color data;

(d) if the pixel has been judged to be chromatic in (b), converting the sub-pixels of the pixel that correspond to the image element to a sub-pixel set of black, red, green or blue based on the chromatic color of the image element, in accordance with a pre-specified condition;

(e) replacing, within a single pixel or a pre-specified sub-pixel group that results from the image element that is judged to be chromatic in (b) and converted to a sub-pixel set of black and the color other than white and black in the conversion in (d), each incidence of a pre-specified sub-pixel set of colors with a pre-specified black-and-white sub-pixel set, wherein step (e) further includes replacing a sub-pixel set of {red, green, blue} with a black-and-white sub-pixel set of one of {white, white, white}, {white, white, black}, {white, black, black} and {black, black, black}; and (f) reordering the sub-pixel set for the sub-pixels of the pixels corresponding to the image element determined to be either chromatic or non-chromatic such that the surface area ratios of white, black, red, green and blue do not change, wherein the above steps are performed by a processor.

8. The image processing method of claim 7, wherein each sub-pixel comprises (i) a back substrate including a red colored layer, a green colored layer and a blue colored layer and (ii) a transparent front substrate, the white particles and the black particles being enclosed between the back substrate and the front substrate, each sub-pixel displaying one of white, black, red, green or blue, by moving the white particles and the black particles between the back substrate and the transparent front substrate.

9. A non-transitory storage medium readable by a computer, the non-transitory storage medium storing a program of instructions executable by the computer to perform a function for displaying image data that is represented by collection of image elements, the function comprising the steps of:

(a) acquiring a plurality of pixels corresponding to the collection of image elements, each pixel comprising a plurality of sub-pixels, each sub pixel comprising white particles, black particles and a colored layer and displaying one of white, black or a color of the colored layer, by moving the white particles and the black particles within the sub-pixel, wherein when the sub-pixel is displaying one of white, black or the color other than white or black, the other colors are not displayed;

(b) after acquiring the image data, for each image element of the image data, judging whether the image element is a chromatic color or a non-chromatic color;

(c) if the pixel has been judged to be non-chromatic in step (b), selecting a pre-specified black-and-white sub-pixel set for the sub-pixels of the pixel that correspond to the image element in accordance with a gray level of the non-chromatic color of the image element;

(d) if the pixel has been judged to be chromatic in step (b), converting the sub-pixels of the pixel that correspond to the image element to a sub-pixel set of black and the color other than white and black based on the chromatic color of the image element, in accordance with a pre-specified condition;

(e) replacing, within a single pixel or a pre-specified sub-pixel group that results from the image element that is judged to be chromatic in (b) and converted to a sub-pixel set of black and the color other than white and black in the conversion in step (d), each incidence of a pre-specified sub-pixel set of colors with a pre-specified black-and-white sub-pixel set, wherein step (e) further includes replacing a sub-pixel set of {red, green, blue} with a black-and-white sub-pixel set of one of {white, white, white}, {white, white, black}, {white, black, black} and {black, black, black}; and (f) reordering the sub-pixel set for the sub-pixels of the pixels corresponding to the image element determined to be either chromatic or non-chromatic such that the surface area ratios of white, black, red, green and blue do not change.

10. The non-transitory storage medium of claim 9, wherein each sub-pixel comprises (i) a back substrate including a colored layer and (ii) a transparent front substrate, the white particles and the black particles being enclosed between the back substrate and the front substrate, each sub-pixel displaying one of white, black or the color of the color layer, by moving the white particles and the black particles between the back substrate and the transparent front substrate.

11. A non-transitory storage medium readable by a computer, the non-transitory storage medium storing a program of instructions executable by the computer to perform a function for displaying image data that is represented by a collection of image elements, the function comprising the steps of:

(a) acquiring a plurality of pixels corresponding to the collection of image elements, each pixel comprising a plurality of sub-pixels, each sub-pixel comprising white particles, black particles, a red colored layer, a green colored layer and a blue colored layer and displaying one of white, black, red, green or blue, by moving the white particles and the black particles within the sub-pixel, wherein when the sub-pixel is displaying one of white, black, red, green or blue, the other colors are not displayed;

(b) after acquiring the image data, for each image element of the image data, judging whether the image element is a chromatic color or a non-chromatic color;

(c) if the pixel has been judged to be non-chromatic in step (b), selecting a pre-specified black-and-white sub-pixel set for the sub-pixels of the pixel that correspond to the image element in accordance with a gray level of the non-chromatic color of the image element, which is represented by red, green and blue color data;

(d) if the pixel has been judged to be chromatic in step (b), converting the sub-pixels of the pixel that correspond to the image element to a sub-pixel set of black, red, green or blue based on the chromatic color of the image element, in accordance with a pre-specified condition;

(e) replacing, within a single pixel or a pre-specified sub-pixel group that results from the image element that is judged to be chromatic in (b) and converted to a sub-pixel set of black and the color other than white and black in the conversion in step (d), each incidence of a pre-specified sub-pixel set of colors with a pre-specified black-and-white sub-pixel set, wherein step (e) further includes replacing a sub-pixel set of {red, green, blue} with a black-and-white sub-pixel set of one of {white, white, white}, {white, white, black}, {white, black, black} and {black, black, black}; and (f) reordering the sub-pixel set for the sub-pixels of the pixels of the pixels corresponding to the image element determined to be either chromatic or non-chromatic such that the surface area ratios of white, black, red, green and blue do not change.

12. The non-transitory storage medium of claim 11, wherein each sub-pixel comprises (i) a back substrate including a red colored layer, a green colored layer and a blue colored layer and (ii) a transparent front substrate, the white particles and the black particles being enclosed between the back substrate and the front substrate, each sub-pixel displaying one of white, black, red, green or blue, by moving the white particles and the black particles between the back substrate and the transparent front substrate.

* * * * *